(12) United States Patent
Hanada et al.

(10) Patent No.: US 11,271,020 B2
(45) Date of Patent: Mar. 8, 2022

(54) SEMICONDUCTOR DEVICE AND METHOD FOR MANUFACTURING SEMICONDUCTOR DEVICE

(71) Applicant: Japan Display Inc., Minato-ku (JP)

(72) Inventors: Akihiro Hanada, Tokyo (JP); Masayoshi Fuchi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/906,569

(22) Filed: Jun. 19, 2020

(65) Prior Publication Data

US 2020/0321359 A1    Oct. 8, 2020

Related U.S. Application Data

(63) Continuation of application No. 16/200,157, filed on Nov. 26, 2018, now Pat. No. 10,707,242, which is a
(Continued)

(30) Foreign Application Priority Data

Jun. 10, 2016 (JP) .................................. 2016-116131

(51) Int. Cl.
*H01L 27/12* (2006.01)
*H01L 21/02* (2006.01)
(Continued)

(52) U.S. Cl.
CPC ...... *H01L 27/124* (2013.01); *H01L 21/02063* (2013.01); *H01L 21/76802* (2013.01);
(Continued)

(58) Field of Classification Search
CPC ............ H01L 27/124; H01L 21/02063; H01L 21/76802; H01L 21/76843;
(Continued)

(56) References Cited

U.S. PATENT DOCUMENTS 6,232,228 B1 * 5/2001 Kwag .................... C09K 13/04
216/100
2001/0036726 A1 * 11/2001 Yokoi ............... H01L 21/02063
438/643
(Continued)

FOREIGN PATENT DOCUMENTS

JP        2010-3910        1/2010

OTHER PUBLICATIONS

Chinese Office Action dated Feb. 3, 2020 in Chinese Application No. 201710426030.2, Global Dossier translation, 9 pages.
(Continued)

*Primary Examiner* — Julia Slutsker
(74) *Attorney, Agent, or Firm* — Oblon, McClelland, Maier & Neustadt, L.L.P.

(57) ABSTRACT

According to one embodiment, a semiconductor device includes an insulating substrate, a first semiconductor layer located above the insulating substrate, a second semiconductor layer located above the insulating substrate, an insulating layer which covers the first semiconductor layer and the second semiconductor layer, and includes a first contact hole reaching the first semiconductor layer and a second contact hole reaching the second semiconductor layer, a barrier layer which covers one of the first semiconductor layer inside the first contact hole and the second semiconductor layer inside the second contact hole, and a first conductive layer which is in contact with the barrier layer.

4 Claims, 16 Drawing Sheets

Related U.S. Application Data continuation of application No. 15/617,547, filed on Jun. 8, 2017, now Pat. No. 1,077,174.

(51) Int. Cl.
   *H01L 21/768* (2006.01)
   *H01L 23/522* (2006.01)
   *H01L 23/532* (2006.01)
   *H01L 29/786* (2006.01)

(52) U.S. Cl.
   CPC .. *H01L 21/76843* (2013.01); *H01L 21/76877* (2013.01); *H01L 23/5226* (2013.01); *H01L 23/53223* (2013.01); *H01L 23/53266* (2013.01); *H01L 27/1218* (2013.01); *H01L 27/1222* (2013.01); *H01L 27/1225* (2013.01); *H01L 27/1262* (2013.01); *H01L 29/7869* (2013.01); *H01L 29/78603* (2013.01); *H01L 29/78675* (2013.01)

(58) Field of Classification Search
   CPC ........... H01L 21/76877; H01L 23/5226; H01L 23/53223; H01L 23/53266; H01L 27/1218; H01L 27/1222; H01L 27/1225; H01L 27/1262; H01L 29/78603; H01L 29/78675; H01L 29/7869

See application file for complete search history.

(56) References Cited

U.S. PATENT DOCUMENTS

| | | |
|---|---|---|
| 2006/0178007 A1 | 8/2006 | Nakamura et al. |
| 2007/0181882 A1 | 8/2007 | Lee |
| 2011/0049523 A1* | 3/2011 | Choi ................... H01L 27/1251 257/72 |
| 2013/0248873 A1 | 9/2013 | Kuraguchi et al. |
| 2015/0348909 A1 | 12/2015 | Yamazaki et al. |
| 2016/0247831 A1 | 8/2016 | Makita et al. |

OTHER PUBLICATIONS

Japanese Office Action dated Feb. 4, 2020 in Japanese Application No. 2016-116131, Global Dossier translation, 4 pages.

* cited by examiner

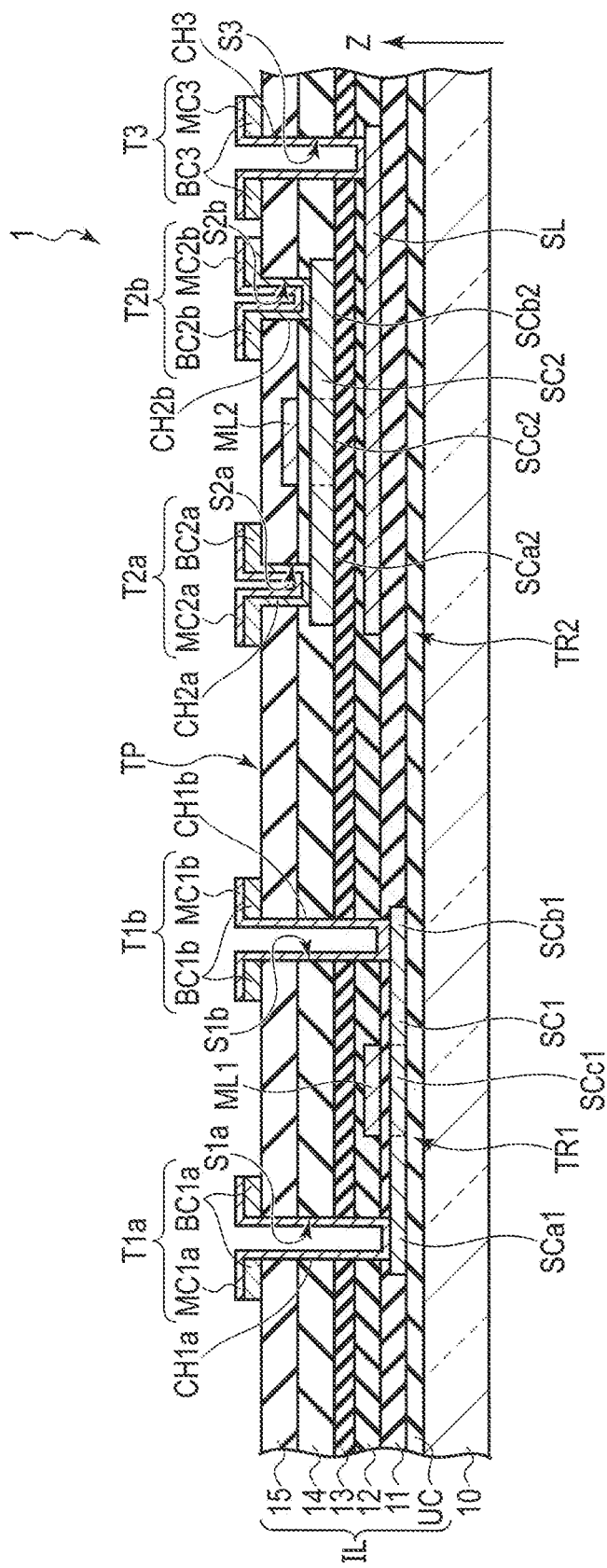
F I G. 1

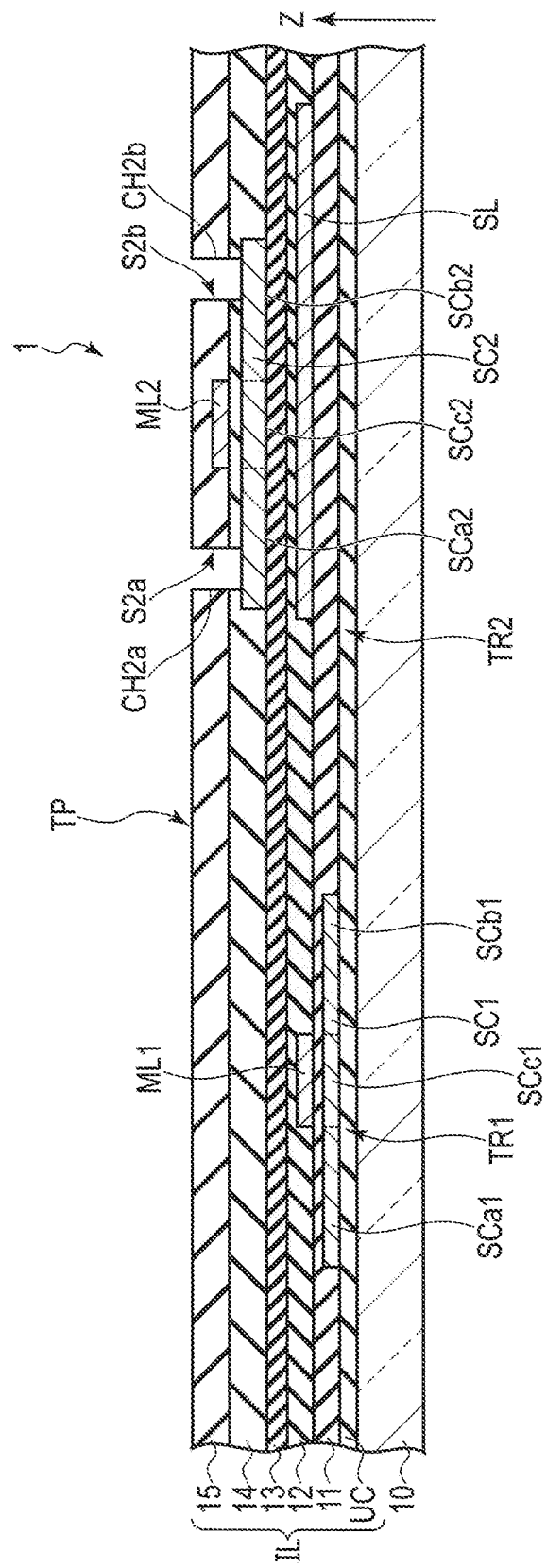
F I G. 2A

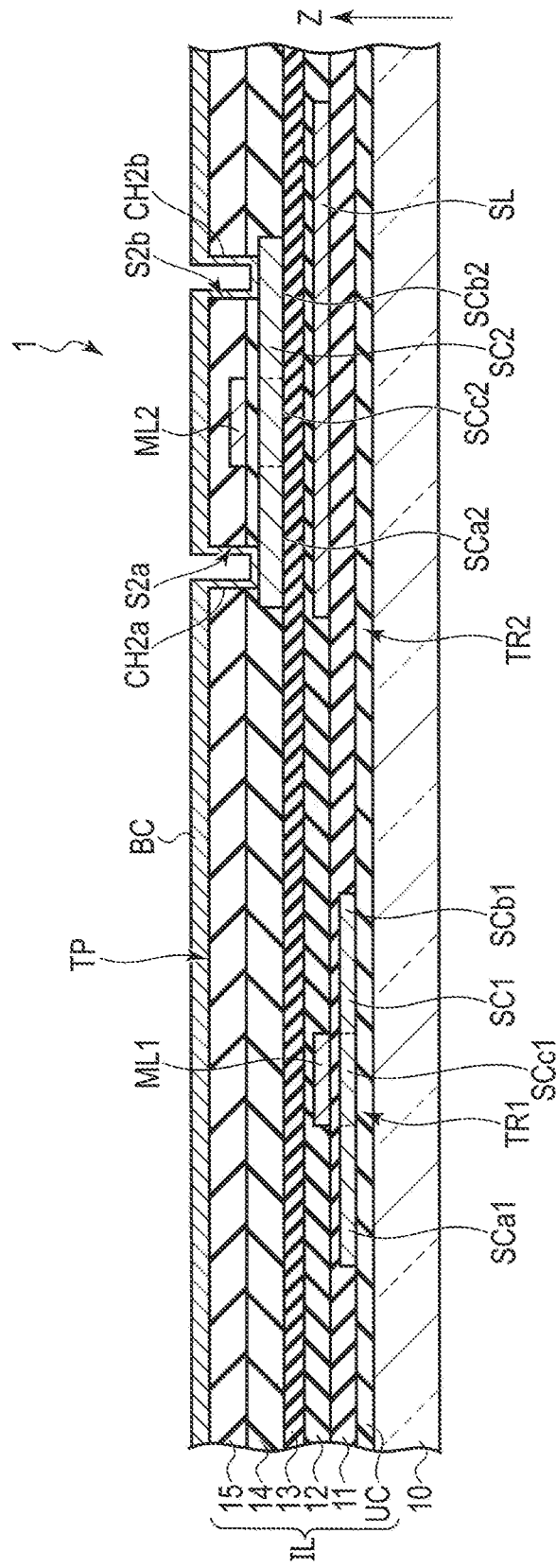
F I G. 2B

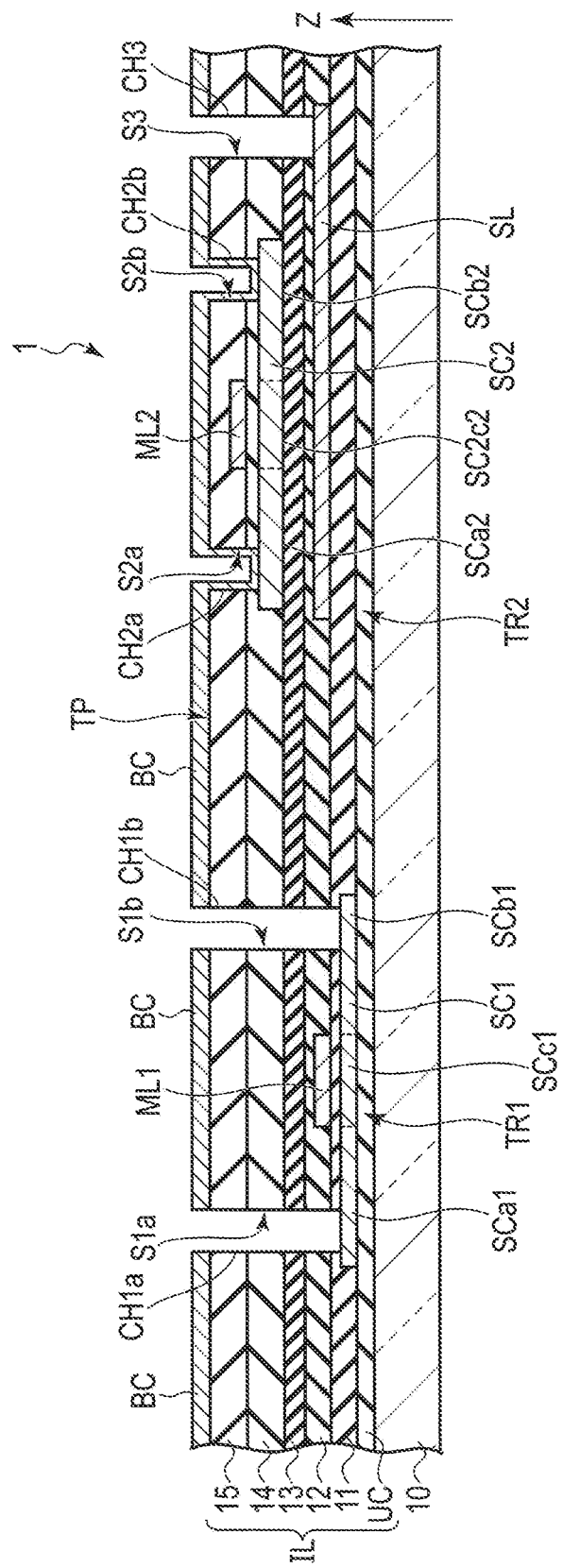
F I G. 2C

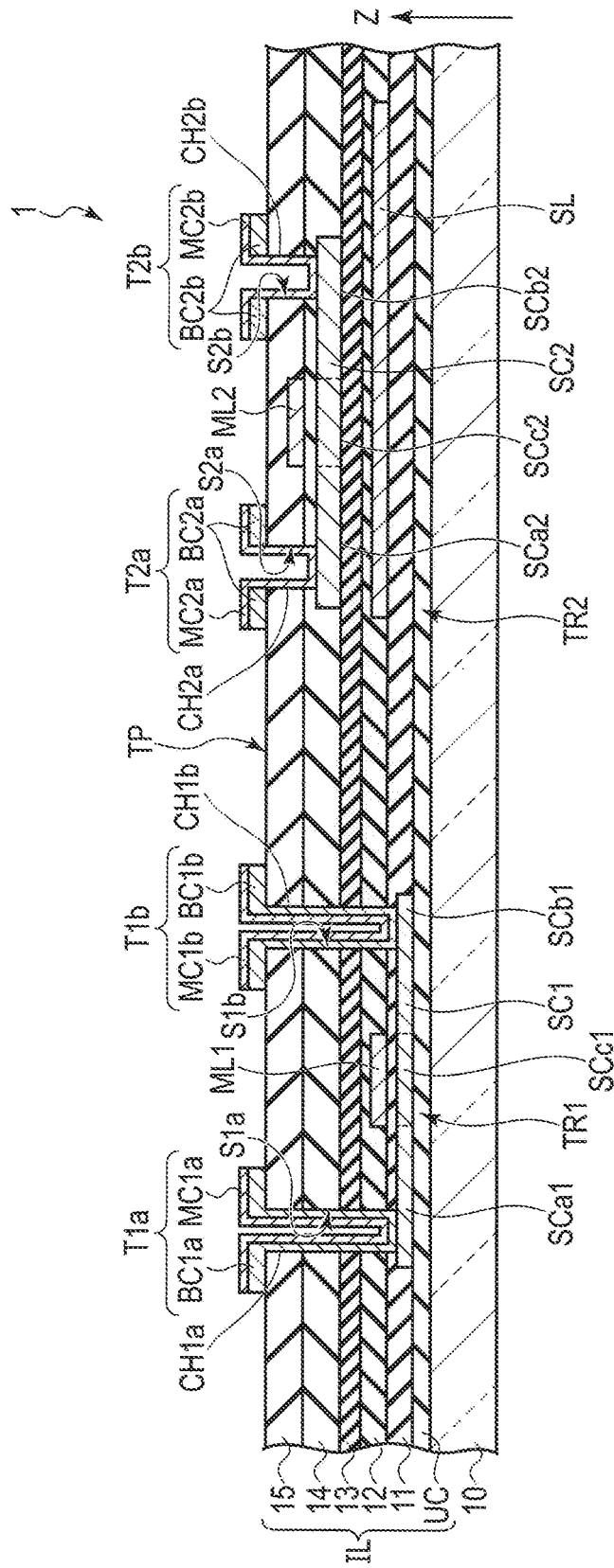
F I G. 3

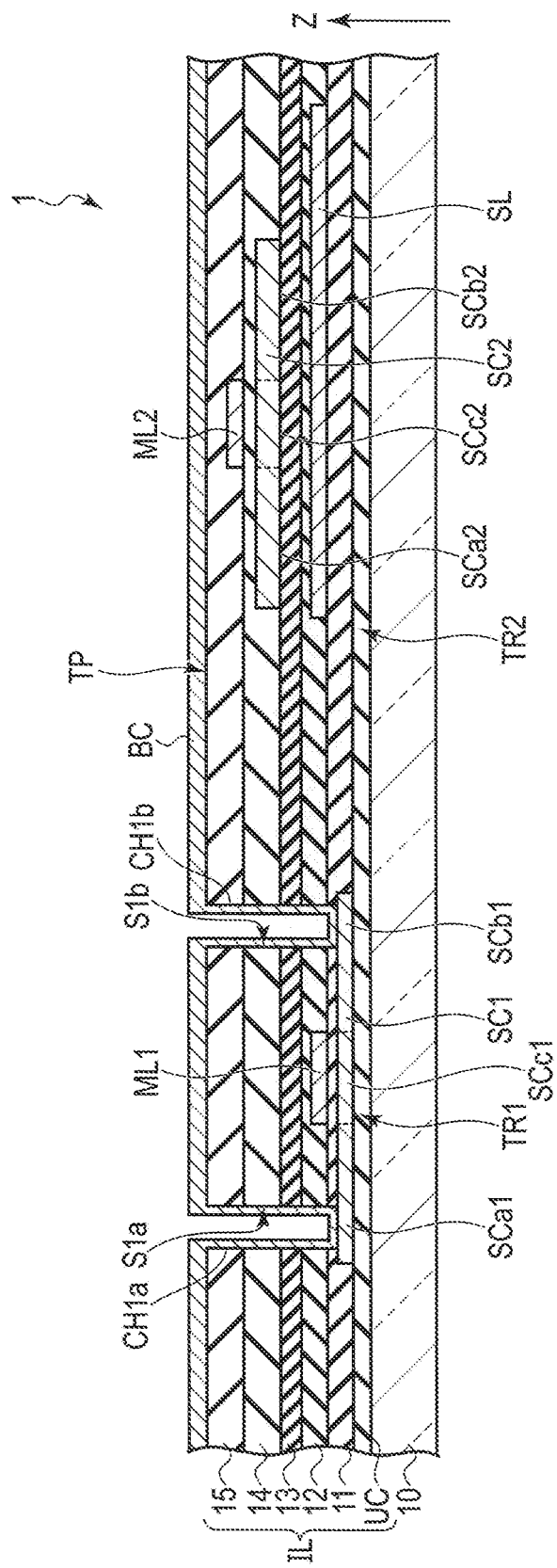
F I G. 4B

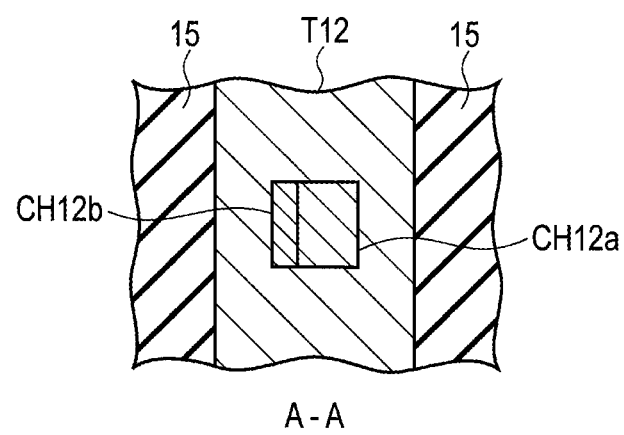
F I G. 6

SEMICONDUCTOR DEVICE AND METHOD FOR MANUFACTURING SEMICONDUCTOR DEVICE

CROSS-REFERENCE TO RELATED APPLICATIONS

This application is a continuation of U.S. application Ser. No. 16/200,157, filed Nov. 26, 2018, which is a continuation of U.S. application Ser. No. 15/617,547, filed Jun. 8, 2017, which is based upon and claims the benefit of priority from Japanese Patent Application No. 2016-116131, filed Jun. 10, 2016, the entire contents of all of which are incorporated herein by reference.

FIELD

Embodiments described herein relate generally to a semiconductor device and a method for manufacturing a semiconductor device.

BACKGROUND

The characteristics of a thin-film transistor widely vary depending on the material used for the semiconductor layer. For example, when a low-temperature polycrystalline silicon semiconductor is used for the semiconductor layer, the reliability of the thin-film transistor is increased. When an oxide semiconductor is used for the semiconductor layer, the off-current of the thin-film transistor is less. In a display device comprising a thin-film transistor having a semiconductor layer formed of polycrystalline silicon and a thin-film transistor having a semiconductor layer formed of oxide on the same substrate, a technology for providing the semiconductor layer formed of oxide above the semiconductor layer formed of polycrystalline silicon is known. In the display device, cleaning is applied to remove a natural oxide film formed on the surface of the semiconductor layer formed of polycrystalline silicon after a contract hole which penetrates to the semiconductor layer formed of polycrystalline silicon is formed. At this time, the semiconductor layer formed of oxide might be etched by a cleaning liquid such as hydrofluoric acid (HF) used for cleaning.

BRIEF DESCRIPTION OF THE DRAWINGS

FIG. 1 is a cross-sectional view showing an example of the structure of a semiconductor device according to a first embodiment.

FIG. 2A is a cross-sectional view showing a step for forming contact holes according to the first embodiment.

FIG. 2B is a cross-sectional view showing a step for forming a barrier layer according to the first embodiment.

FIG. 2C is a cross-sectional view showing a step for forming contact holes according to the first embodiment.

FIG. 3 is a cross-sectional view showing an example of the structure of a semiconductor device according to a second embodiment.

FIG. 4B is a cross-sectional view showing a step for forming a barrier layer according to the second embodiment.

FIG. 6 is a plan view when a terminal is viewed from line A-A of FIG. 5.

DETAILED DESCRIPTION

Figure 2D:
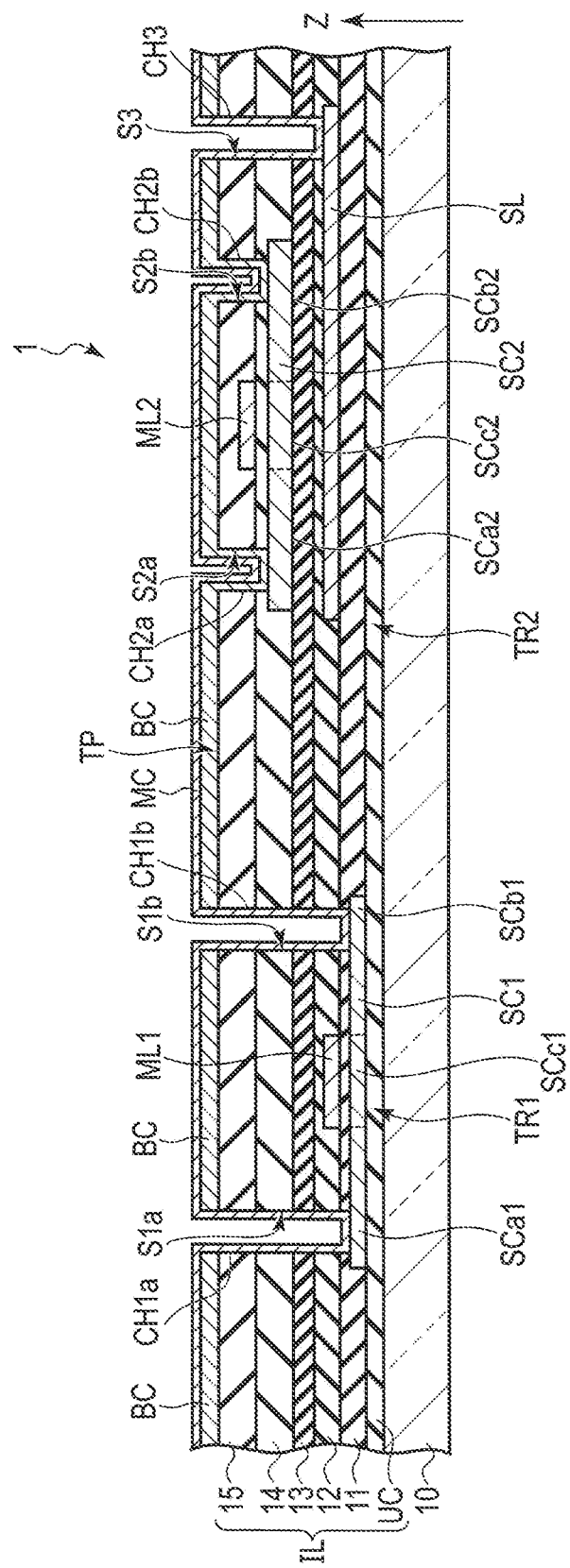
FIG. 2D is a cross-sectional view showing a step for forming a conductive layer according to the first embodiment.

In general, according to one embodiment, a semiconductor device comprises: an insulating substrate; a first semiconductor layer located above the insulating substrate; a second semiconductor layer located above the insulating substrate and formed of a material different from a material of the first semiconductor layer; an insulating layer which is located above the insulating substrate, covers the first semiconductor layer and the second semiconductor layer, and comprises a first contact hole reaching the first semiconductor layer and a second contact hole reaching the second semiconductor layer; a barrier layer which covers one of the first semiconductor layer inside the first contact hole and the second semiconductor layer inside the second contact hole, and is conductive; and a first conductive layer which is in contact with the barrier layer.

According to another embodiment, a method for manufacturing a semiconductor device comprises: an insulating substrate; a first insulating layer; a second insulating layer located above the first insulating layer; a first semiconductor layer located between the insulating substrate and the first insulating layer; and a second semiconductor layer located between the first insulating layer and the second insulating layer and formed of a material different from a material of the first semiconductor layer, the method comprising: forming a first contact hole in the second insulating layer so as to reach the second semiconductor layer; forming a barrier layer on the second insulating layer and on the second semiconductor layer inside the first contact hole; forming a second contact hole in the barrier layer, the first insulating layer and the second insulating layer so as to reach the first semiconductor layer; and forming a first conductive layer which is in contact with the barrier layer inside the first contact hole, and is in contact with the second semiconductor layer inside the second contact hole, wherein the barrier layer is conductive.

According to another embodiment, a method for manufacturing a semiconductor device comprises: an insulating substrate; a first insulating layer; a second insulating layer located above the first insulating layer; a first semiconductor layer located between the insulating substrate and the first insulating layer; and a second semiconductor layer located between the first insulating layer and the second insulating layer and formed of a material different from a material of the first semiconductor layer, the method comprising: forming a first contact hole in the first insulating layer and the second insulating layer so as to reach the first semiconductor layer; forming a barrier layer on the second insulating layer and on the first semiconductor layer inside the first contact hole; forming a second contact hole in the barrier layer and the second insulating layer so as to reach the second semiconductor layer; and forming the first conductive layer which is in contact with the barrier layer inside the first contact hole, and is in contact with the second semiconductor layer inside the second contact hole, wherein the barrier layer is conductive.

Embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the explanation of the embodiments, an upward direction (or upper side) is equivalent to the direction of arrow Z. A downward direction (or lower side) is equivalent to a direction opposite to that of arrow Z.

FIG. 1 is a cross-sectional view showing an example of the structure of a semiconductor device 1 according to a first embodiment. The semiconductor device 1 shown in FIG. 1 is a thin-film transistor (TFT) substrate comprising a plurality of thin-film transistors TR1 and TR2.

The semiconductor device 1 comprises an insulating substrate 10, an undercoat layer UC, a semiconductor layer SC1, an insulating film 11, a gate electrode ML1, a metal layer SL, an insulating film 12, an insulating film 13, a semiconductor layer SC2, an insulating film 14, a gate electrode ML2, and an insulating film 15. In the following explanation, the undercoat layer UC and insulating films 11, 12, 13, 14 and 15 stacked on the insulating substrate 10 may be collectively called an insulating layer IL. In the insulating layer IL, insulating films 11, 12 and 13 located between semiconductor layers SC1 and SC2 may be called an insulating interlayer. Insulating films 11, 12 and 13 may be collectively called a first insulating layer. Insulating films 14 and 15 may be collectively called a second insulating layer.

The insulating substrate 10 is formed of, for example, a phototransmissive glass substrate or resin substrate. The undercoat layer UC is an insulating layer, and is located on the insulating substrate 10. The undercoat layer UC may have either a single-layer structure or a multilayer structure. For example, the undercoat layer UC comprises a silicon nitride film and a silicon oxide film.

Semiconductor layer SC1 is located above the insulating substrate 10. In the example of FIG. 1, semiconductor layer SC1 is formed on the undercoat layer UC. Semiconductor layer SC1 is a silicon semiconductor. For example, semiconductor layer SC1 is formed of polycrystalline silicon. Semiconductor layer SC1 comprises a high-resistive area SCc1, and low-resistive areas SCa1 and SCb1 in which the electric resistance is lower than that of high-resistive area SCc1. Although not shown in the drawings, a light-shielding film may be provided between the insulating substrate 10 and semiconductor layer SC1.

Insulating film 11 covers semiconductor layer SC1. In the example of FIG. 1, insulating film 11 is located on the undercoat layer UC as well as semiconductor layer SC1. For example, insulating film 11 is formed of silicon oxide.

Gate electrode 5L1 is located on insulating film 11, and faces semiconductor layer SC1 via insulating film 11. Gate electrode ML1 faces high-resistive area SCc1 of semiconductor layer SC1. The metal layer SL is located on insulating film 11, and is located away from gate electrode ML1. Each of gate electrode ML1 and the metal layer SL is formed of a conductive metal material. In the example of FIG. 1, gate electrode ML1 and the metal layer SL are located in the same layer. Therefore, they may be simultaneously formed using the same material. Gate electrode ML1 is electrically connected to a first scanning line (not shown). The metal layer SL is located right under semiconductor layer SC2. The metal layer SL may function as a light-shielding film which prevents irradiation of semiconductor layer SC2 with light having passed through the insulating substrate 10 and the undercoat layer UC. The metal layer SL may function as a gate electrode. The metal layer SL may function as the electrode of storage capacitance. The pattern area of the metal layer SL may be changed depending on the purpose. When the metal layer SL functions as a light-shielding film, the metal layer SL may be replaced by a layer formed of a material other than metal. When the semiconductor device 1 is applied to an organic electroluminescent (EL) display device, the metal layer SL may be omitted.

Insulating film 12 is located on insulating film 11, and covers gate electrode ML1 and the metal layer SL. For example, insulating film 12 is formed of silicon nitride.

Insulating film 13 is located on insulating film 12. In the example of FIG. 1, insulating film 13 is located between insulating films 12 and 14. For example, insulating film 13 is formed of silicon oxide.

With respect to the insulating substrate 10, semiconductor layer SC2 is located on an upper side in comparison with semiconductor layer SC1. In the example of FIG. 1, semiconductor layer SC2 is located on insulating film 13, and faces the metal layer SL via insulating films 12 and 13. Semiconductor layer SC2 is a semiconductor formed of metal oxide. In terms of semiconductivity, the metal oxide of semiconductor layer SC2 preferably contains at least one metal selected from indium, gallium, zinc and tin. Semiconductor layer SC2 comprises a high-resistive area SCc2, and low-resistive areas SCa2 and SCb2 in which the electric resistance is lower than that of high-resistive area SCc2.

Insulating film 14 is located on insulating film 13, and covers semiconductor layer SC2. For example, insulating film 14 is formed of silicon oxide.

Gate electrode ML2 is located on insulating film 14, and faces semiconductor layer SC2 via insulating film 14. Gate electrode ML2 faces high-resistive area SCc2 of semiconductor layer SC2. Gate electrode ML2 is formed of a conductive metal material. Gate electrode ML2 is electrically connected to a second scanning line (not shown). Insulating film 15 covers gate electrode ML2. In the example of FIG. 1, insulating film 15 is located on insulating film 14 as well as gate electrode ML2.

Insulating film 15 may have either a single-layer structure or a multilayer structure. For example, insulating film 15 is formed of silicon nitride or silicon oxide.

The semiconductor device 1 further comprises terminals T1a, T1b, T2a, T2b and T3. Terminals T1a, Tb, T2a, T2b and T3 are located on insulating film 15. Terminals Tia, T1b, T2a, T2b and T3 are electrically connected to lines (not shown), etc. In the example of FIG. 1, terminals T1a, T1b, T2a, T2b and T3 comprise barrier layers BC1a, BC1b, BC2a, BC2b and BC3, respectively, and conductive layers MC1a, MC1b, MC2a, MC2b and MC3, respectively.

Barrier layers BC1a, BC1b, BC2a, BC2b and BC3 are formed of the same conductive metal, alloy or low-resistive oxide. In the present embodiment, a barrier layer BC is preferably resistant to a material used for cleaning in the manufacturing method explained later, such as hydrofluoric acid. Barrier layers BC1a, BC1b, BC2a, BC2b and BC3 may have either a single-layer structure or a multilayer structure, and are formed of, for example, titanium (Ti). Barrier layers BC1a, BC1b, BC2a, BC2b and BC3 may be called conductive layers.

Conductive layers MC1a, MC1b, MC2a, MC2b and MC3 are formed of, for example, a conductive metal material, and may have either a single-layer structure or a multilayer structure. For example, conductive layers MC1a, MC1b, MC2a, MC2b and MC3 have a multilayer structure of titanium/aluminum/titanium.

As seen in plan view, the end portions of terminals T1a, T1b, T2a, T2b and T3 are formed such that conductive layers MC1a, MC1b, MC2a, MC2b and MC3 overlap barrier layers BC1a, BC1b, BC2a, BC2b and BC3.

Terminals T1a and T1b cover the inside of contact holes CH1a and CH1b, respectively, penetrating insulating films 11, 12, 13, 14 and 15, and are electrically connected to semiconductor layer SC1. In the following explanation, the surface including insulating films 11, 12, 13, 14 and 15 inside contact hole CH1a is called a side surface S1a. The surface including insulating films 11, 12, 13, 14 and 15 inside contact hole CH1b is called a side surface S1b. In the example of FIG. 1, with respect to terminals T1a and T1b, barrier layers BC1a and BC1b are located on the top surface TP of insulating film 15 (or the insulating layer IL) on which contact holes CH1a and CH1b are formed. Neither barrier layer BC1a nor barrier layer BC1b is present on semiconductor layer SC1 in contact hole CH1a or CH1b. Above insulating film 15, conductive layers MC1a and MC1b are partially located on barrier layers BC1a and BC1b. Conductive layers MC1a and MC1b cover inner surface S1a of contact hole CH1a and inner surface S1b of contact hole CH1b, and cover semiconductor layer SC1 inside contact holes CH1a and CH1b. Conductive layer MC1a is in contact with inner surface S1a and low-resistive area SCa1 in contact hole CH1a. Conductive layer MC1b is in contact with inner surface S1b and low-resistive area SCb1 in contact hole CH1b. The thickness of the layer of each of terminals T1a and T1b may differ between the top surface TP of insulating film 15 and the inside of contact hole CH1a or CH1b.

Terminals T2a and T2b cover the inside of contact holes CH2a and CH2b, respectively, penetrating insulating films 14 and 15, and are electrically connected to semiconductor layer SC2. In the following explanation, the surface including insulating films 14 and 15 inside contact hole CH2a is called a side surface S2a. The surface including insulating films 14 and 15 inside contact hole CH2b is called a side surface S2b. In the example of FIG. 1, with respect to terminals T2a and T2b, barrier layers BC2a and BC2b are partially located on the top surface TP of insulating film 15, cover inner surface S2a of contact hole CH2a and inner surface S2b of contact hole CH2b, and cover semiconductor layer SC2 inside contact holes CH2a and CH2b. Conductive layers MC2a and MC2b are located on barrier layers BC2a and BC2b above insulating film 15, and are located on barrier layers BC2a and BC2b inside contact holes CH2a and CH2b. Barrier layer BC2a is in contact with inner surface S2a and low-resistive area SCa2 in contact hole CH2a. Conductive layer MC2a is in contact with barrier layer BC2a in contact hole CH2a. Barrier layer BC2b is in contact with inner surface S2b and low-resistive area SCb2 in contact hole CH2b. Conductive layer MC2b is in contact with barrier layer BC2b in contact hole CH2b.

Terminal T3 covers the inside of contact hole CH3 penetrating insulating films 12, 13, 14 and 15, and is electrically connected to the metal layer St. In the following explanation, the surface including insulating films 12, 13, 14 and 15 inside contact hole CH3 is called a side surface S3. In the example of FIG. 1, with respect to terminal T3, barrier layer BC3 is located on the top surface TP of insulating film 15, and is not present in contact hole CH3. Above insulating film 15, conductive layer MC3 is partially located on barrier layer BC3. Conductive layer MC3 covers inner surface S3 of contact hole CH3, and covers the metal layer SL inside contact hole CH3. The thickness of the layer of terminal T3 may differ between on insulating film 15 and inside contact hole CH3. For example, terminal T3 may be electrically connected to the power line of fixed potential and a scanning line (not shown). When terminal T3 is connected to the power line, the metal layer SL is configured to function as a light-shielding film, a capacitive electrode, etc. When terminal T3 is electrically connected to a scanning line, the metal layer SL is configured to functions as the gate electrode of thin-film transistor TR2. The metal layer SL may be electrically floating. In this case, terminal T3 and contact hole CH3 may be omitted.

In the example of FIG. 1, thin-film transistors TR1 and TR2 have a top-gate structure in which gate electrodes ML1 and ML2 are located above semiconductor layers SC1 and SC2, respectively. However, the structures of thin-film transistors TR1 and TR2 are not particularly limited. Thin-film transistors TR1 and TR2 may have a bottom-gate structure.

Now, this specification explains a method for manufacturing the semiconductor device 1 of the present embodiment, referring to FIG. 2A, FIG. 2B, FIG. 2C and FIG. 2D.

FIG. 2A is a cross-sectional view showing a step for forming contact holes CH2a and CH2b according to the present embodiment. FIG. 2B is a cross-sectional view showing a step for forming barrier layer BC according to the present embodiment. FIG. 2C is a cross-sectional view showing a step for forming contact holes CH1a and CH1b according to the present embodiment. FIG. 2D is a cross-sectional view showing a step for forming a conductive layer MC according to the present embodiment.

As shown in FIG. 2A, contact holes CH2a and CH2b are formed after the insulating layer IL, semiconductor layers SC1 and SC2, the metal layer SL and gate electrodes ML1 and ML2 are formed on the insulating substrate 10. More specifically, a photoresist patterned by a photolithography process is formed on insulating film 15. Subsequently, contact holes CH2a and CH2b are formed in the insulating layer IL to semiconductor layer SC2 by a photo-etching process (hereinafter, simply referred to as photo-etching) for etching the area exposed from the photoresist.

Subsequently, as shown in FIG. 2B, barrier layer BC is formed on the insulating layer IL in the state shown in FIG. 2A, and is formed on semiconductor layer SC2 via inner surface S2a of contact hole CH2a and inner surface S2b of contact hole CH2b. Barrier layer BC is a layer in a state before processing into barrier layers BC1a, BC1b, BC2a, BC2b and BC3.

Subsequently, as shown in FIG. 2C, contact holes CH1a and CH1b are formed by etching barrier layer BC and the insulating layer IL all together so as to reach semiconductor layer SC1. For example, photo-etching is used for this process. Subsequently, cleaning using, for example, hydrofluoric acid (HF), is performed to remove the natural oxide film of semiconductor layer SC1, such as a silicon (Si) oxide film. At this time, semiconductor layer SC2 is protected by barrier layer BC from hydrofluoric acid as a substance for cleaning. As shown in FIG. 2C, when contact holes CH1a and CH1b are formed, contact hole CH3 may be formed by applying photo-etching to barrier layer BC and the insulating layer IL all together so as to reach the metal layer SL in a manner similar to that of contact holes CH1a and CH1b.

As shown in FIG. 2D, conductive layer MC is formed on barrier layer BC shown in FIG. 2C, and is formed on semiconductor layer SC1 via inner surface S1a of contact hole CH1a and inner surface S1b of contact hole CH1b. Conductive layer MC is formed on barrier layer BC shown in FIG. 2C, and is formed on the metal layer SL via inner surface S3 of contact hole CH3. Conductive layer MC is a layer in a state before processing into conductive layers MC1a, MC1b, MC2a, MC2b and MC3. Lastly, barrier layer BC and conductive layer MC shown in FIG. 2D are patterned all together by, for example, photo-etching. In this way, for example, terminals T1a, T1b, T2a, T2b and T3 of the semiconductor device 1 shown in FIG. 1 are formed.

As explained above, according to the present embodiment, contact holes CH1a and CH1b are formed by etching barrier layer BC and the insulating layer IL all together after barrier layer BC is formed in contact holes CH2a and CH2b. Thus, in the semiconductor device 1, the natural oxide film of semiconductor layer SC1 formed of polycrystalline silicon can be removed by cleaning in a state where oxide semiconductor layer SC2 is protected. Since barrier layer BC is conductive, there is no need to remove barrier layer BC from contact hole CH2a or CH2b. Thus, it is possible to form terminals T2a and T2b electrically connected to semiconductor layer SC2. Moreover, the number of manufacturing steps can be reduced by etching barrier layer BC and the insulating layer IL all together. When thin-film transistor TR2 has a top-gate structure in the semiconductor device 1, a step for forming, on semiconductor layers SCa2 and SCb2, a conductive layer which prevents the contact holes from penetrating the semiconductor layers at the time of forming the contact holes, such as a metal layer, is not required. Thus, the semiconductor device 1 can prevent decrease in reliability and improve productivity.

Now, this specification explains semiconductor devices according to other embodiments. In the following embodiments, the same elements as those of the first embodiment are denoted by the same reference numbers, detailed description thereof being omitted. Elements different from those of the first embodiment are mainly explained in detail. Effects similar to those of the first embodiment can be obtained by the following embodiments.

FIG. 3 is a cross-sectional view showing an example of the structure a semiconductor device according to a second embodiment. The semiconductor device 1 of the second embodiment is different from that of the first embodiment in terms of the positions of barrier layers BC1a, BC1b, BC2a and BC2b and conductive layers MC1a, MC1b, MC2a and MC2b. In the example of FIG. 3, neither a contact hole CH3 nor a terminal T3 is provided in the semiconductor device 1. However, the semiconductor device 1 may comprises these elements in the same manner as that of the second embodiment.

In the example of FIG. 3, with regard to terminals T1a and T1b, barrier layers BC1a and BC1b are partially located on the top surface TP of an insulating film 15, cover an inner surface S1a of a contact hole CH1a and an inner surface S1b of a contact hole CH1b, and cover a semiconductor layer SC1 inside contact holes CH1a and CH1b. Conductive layers MC1a and MC1b are located on barrier layers BC1a and BC1b, respectively. In the example of FIG. 3, with regard to terminals T2a and T2b, barrier layers BC2a and BC2b are located on the top surface TP of insulating film 15 on which contact holes CH2a and CH2b are formed. Neither barrier layer BC2a nor barrier layer BC2b is present inside contact hole CH2a or CH2b. Conductive layers NC2a and MC2b are partially located on barrier layers BC2a and BC2b, cover an inner surface S2a of contact hole CH2a and an inner surface S2b of contact hole CH2b, and cover a semiconductor layer SC2 inside contact holes CH2a and CH2b.

Now, this specification explains a method for manufacturing the semiconductor device 1 of the present embodiment, referring to FIG. 4A, FIG. 4B, FIG. 4C and FIG. 4D.

Figure 4A:
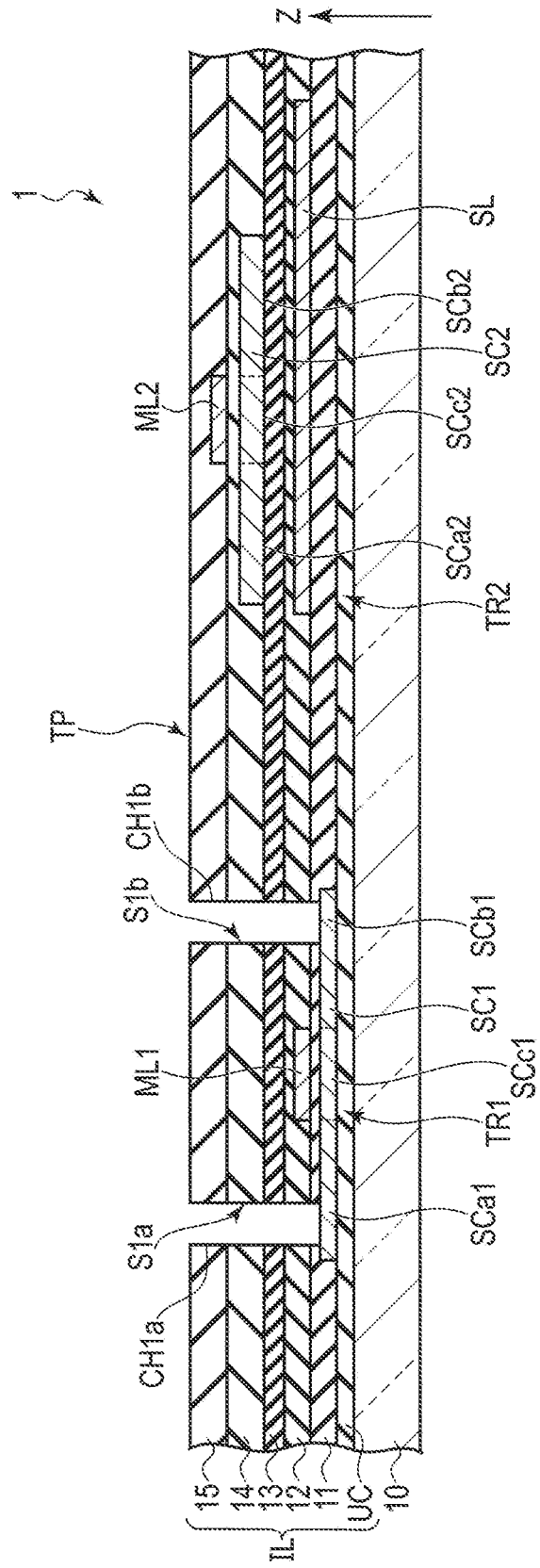
FIG. 4A is a cross-sectional view showing a step for forming contact holes according to the second embodiment.
Figure 4C:
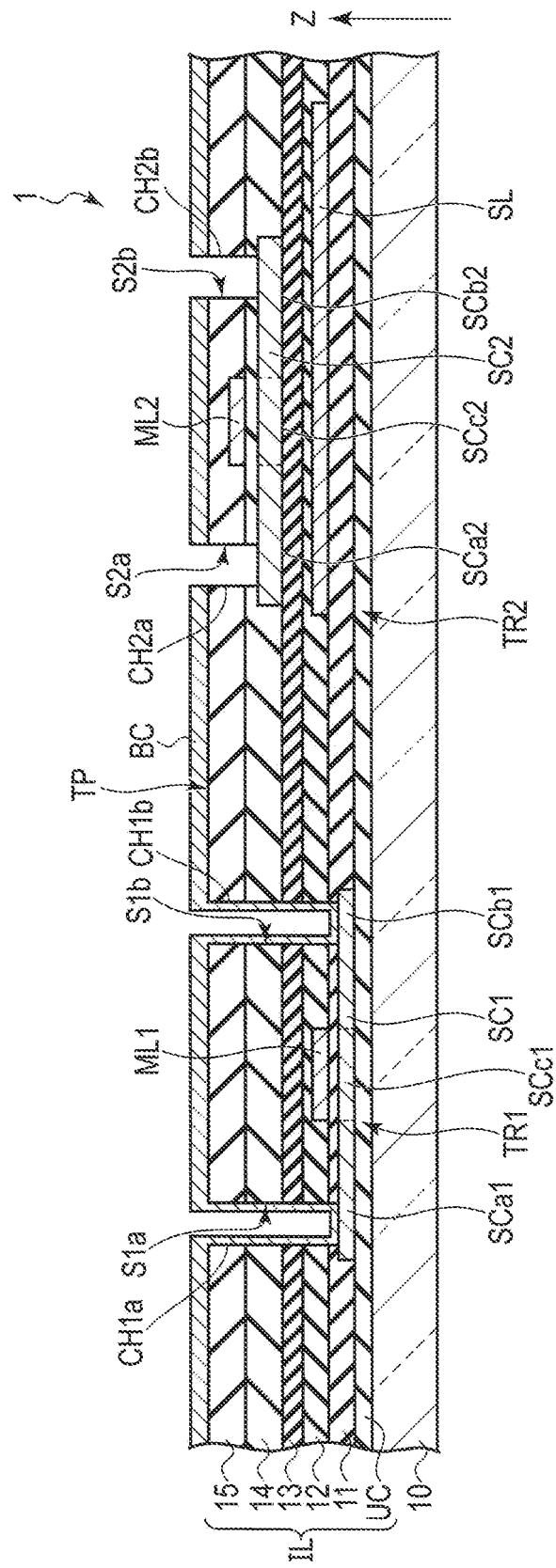
FIG. 4C is a cross-sectional view showing a step for forming contact holes according to the second embodiment.
Figure 4D:
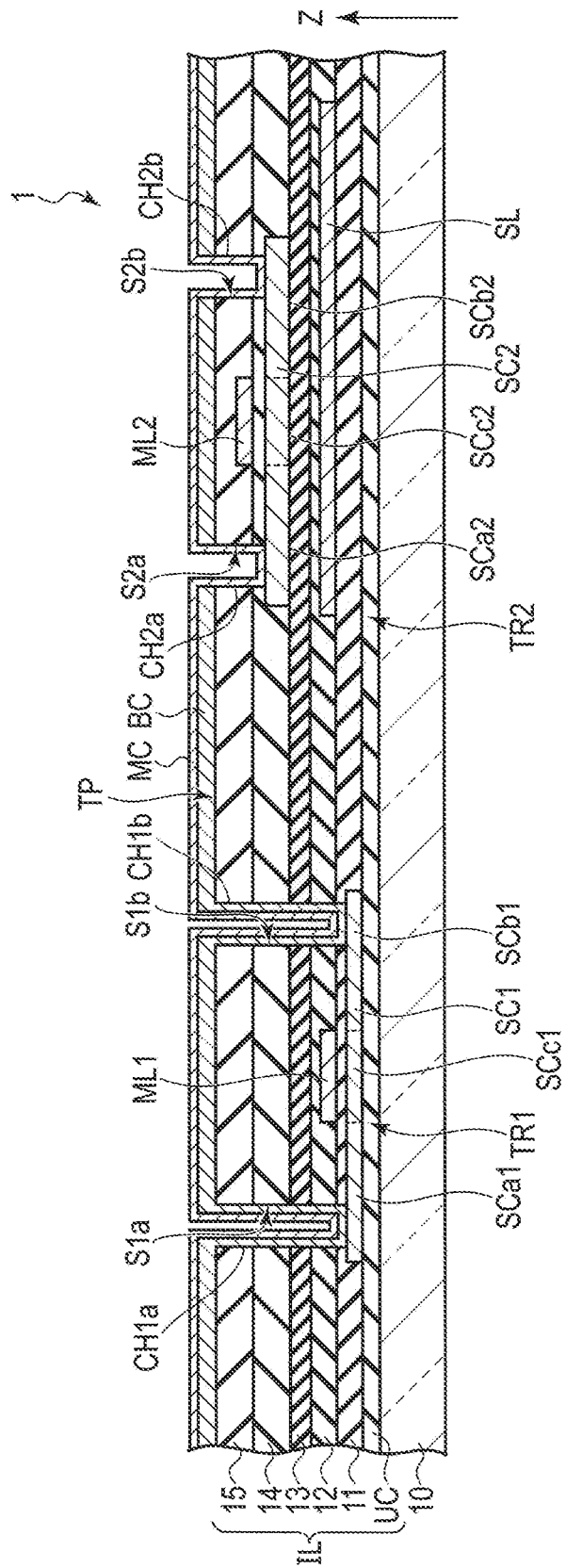
FIG. 4D is a cross-sectional view showing a step for forming a conductive layer according to the second embodiment.

FIG. 4A is a cross-sectional view showing a step for forming contact holes CH1a and CH1b according to the present embodiment. FIG. 4B is a cross-sectional view showing a step for forming a barrier layer BC according to the present embodiment. FIG. 4C is a cross-sectional view showing a step for forming contact holes CH2a and CH2b according to the present embodiment. FIG. 4D is a cross-sectional view showing a step for forming a conductive layer MC according to the present embodiment.

As shown in FIG. 4A, contact holes CH1a and CH1b are formed in an insulating layer IL so as to reach semiconductor layer SC1 by photo-etching (or a photo-etching process). Subsequently, cleaning is performed to remove the natural oxide film of semiconductor layer SC1.

Subsequently, as shown in FIG. 4B, to prevent oxidation of semiconductor layer SC1, barrier layer BC is formed on the insulating layer IL in the state shown in FIG. 4A, and is formed on semiconductor layer SC1 via inner surface S1a of contact hole CH1a and inner surface S1b of contact hole CH1b.

Subsequently, as shown in FIG. 4C, contact holes CH2a and CH2b are formed by etching barrier layer BC and the insulating layer IL all together to semiconductor layer SC2. For example, photo-etching is used for this process.

Further, as shown in FIG. 4D, conductive layer MC is formed on barrier layer BC in the state shown in FIG. 4C, and is formed on semiconductor layer SC2 via inner surface S2a of contact hole CH2a and inner surface S2b of contact hole CH2b. Lastly, barrier layer BC and conductive layer MC shown in FIG. 4D are patterned all together by, for example, photo-etching. In this way, for example, terminals T1a, T1b, T2a and T2b of the semiconductor device 1 of FIG. 3 are formed.

Effects similar to those of the first embodiment are obtained by the second embodiment.

Figure 5:
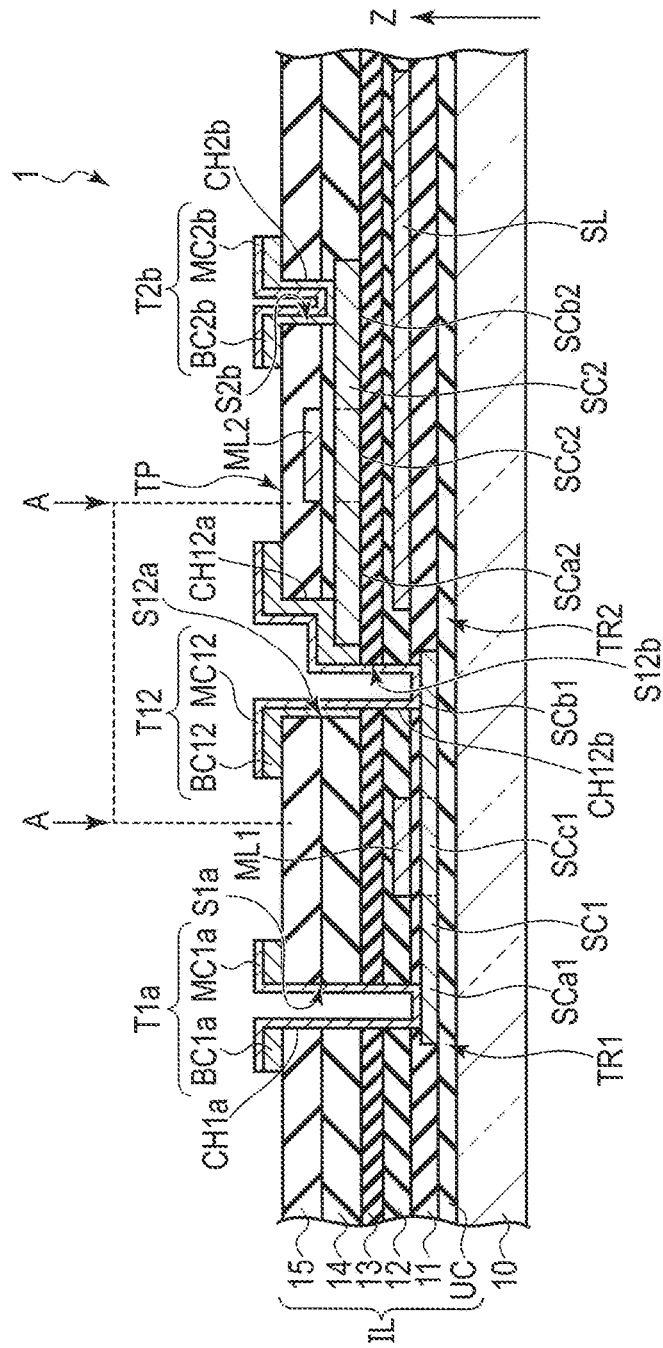
FIG. 5 is a cross-sectional view showing an example of the structure of a semiconductor device according to a third embodiment.

FIG. 5 is a cross-sectional view showing an example of the structure of a semiconductor device according to a third embodiment.

The semiconductor device 1 of the third embodiment is different from that of the above embodiments in respect that the distance between thin-film transistors TR1 and TR2 is shorter than that of the above embodiments.

The semiconductor device 1 of the present embodiment comprises a contact hole CH12b formed inside the edge of a contact hole CH12a, and comprises a terminal T12 in place of terminals T1b and T2a of the above embodiments. Terminal T12 comprises a barrier layer BC12 and a conductive layer MC12. Terminal T12 covers the inside of contact holes CH12a and CH12b, and is electrically connected to semiconductor layers SC1 and SC2. The surface including insulating films 14 and 15 inside contact hole CH12a is called a side surface S12a. The surface including insulating films 11 and 12 inside contact hole CH12b is called a side surface S12b. In the example of FIG. 5, with respect to terminal T12, barrier layer BC12 is partially located on insulating film 15, covers inner surface S12a of contact hole S12a, and covers semiconductor layer SC2 inside contact hole CH12a. Above insulating film 15, conductive layer MC12 is partially located on barrier layer BC12. Conductive layer MC12 covers inner surface S12b of contact hole S12b, and covers semiconductor layer SC1 inside contact hole CH12b formed inside the edge of contact hole CH12a. Thus, conductive layer MC12 electrically connects semiconductor layers SC1 and SC2.

FIG. 6 is a plan view when terminal T12 is viewed from line A-A of FIG. 5.

As shown in FIG. 6, contact holes CH12a and CH12b are formed so as to overlap each other in a plan view. Contact holes CH12a and CH12b do not need to entirely overlap each other in a plan view. Contact holes CH12a and CH12b should be at least partially overlap each other. As shown in FIG. 6, in terminal T12, the end surfaces of barrier layer BC12 and conductive layer MC12 are formed so as to be aligned with each other in a plan view.

Now, this specification explains a method for manufacturing the semiconductor device 1 of the present embodiment, referring to FIG. 7A, FIG. 7B, FIG. 7C and FIG. 7D. A manufacturing process similar to that of the first embodiment can be used to manufacture terminals T1a and T2b. Thus, detailed description thereof is omitted.

Figure 7A:
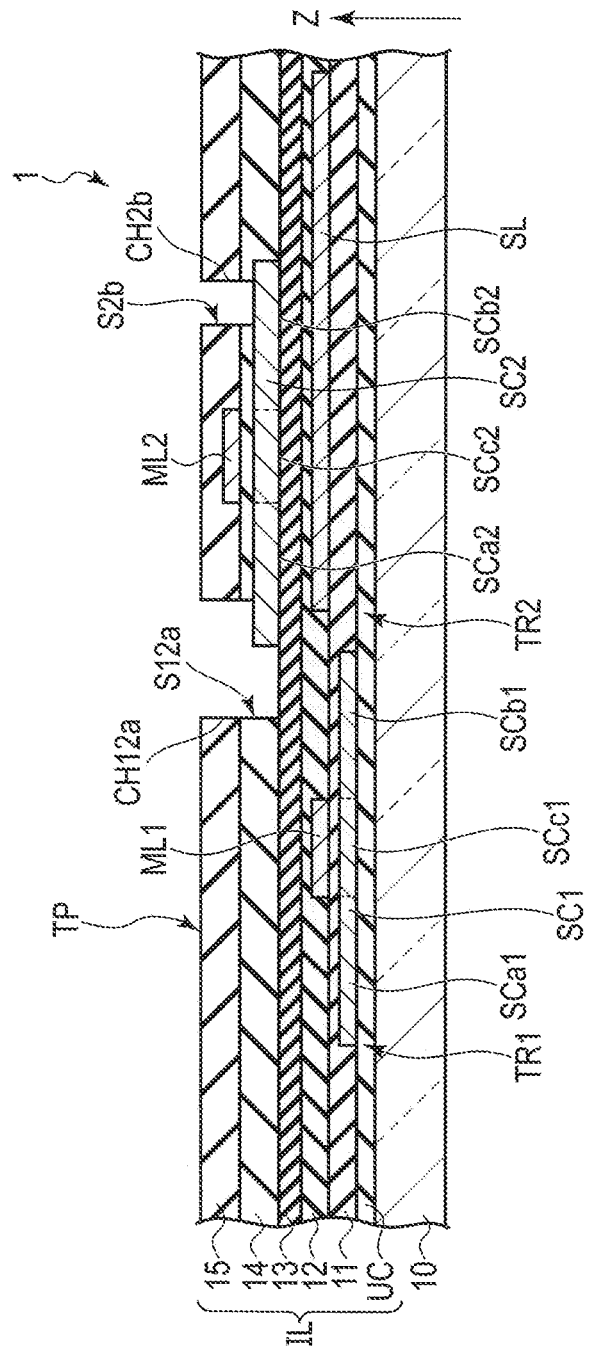
FIG. 7A is a cross-sectional view showing a step for forming a contact hole according to the third embodiment.
Figure 7B:
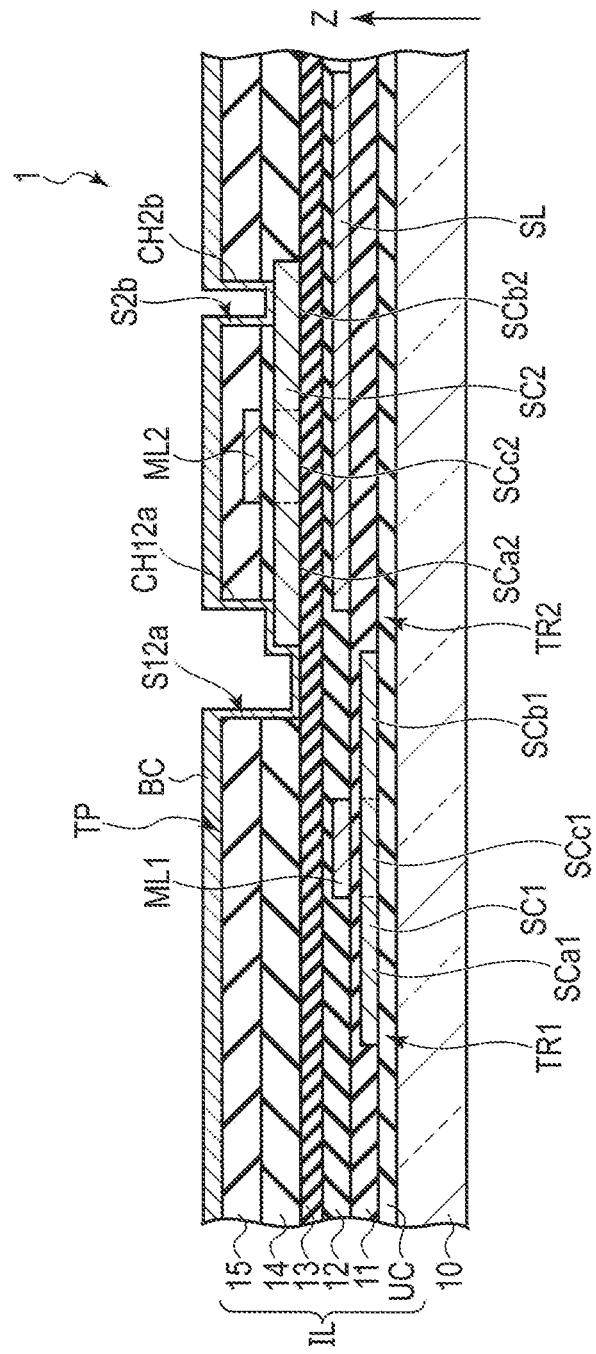
FIG. 7B is a cross-sectional view showing a step for forming a barrier layer according to the third embodiment.
Figure 7C:
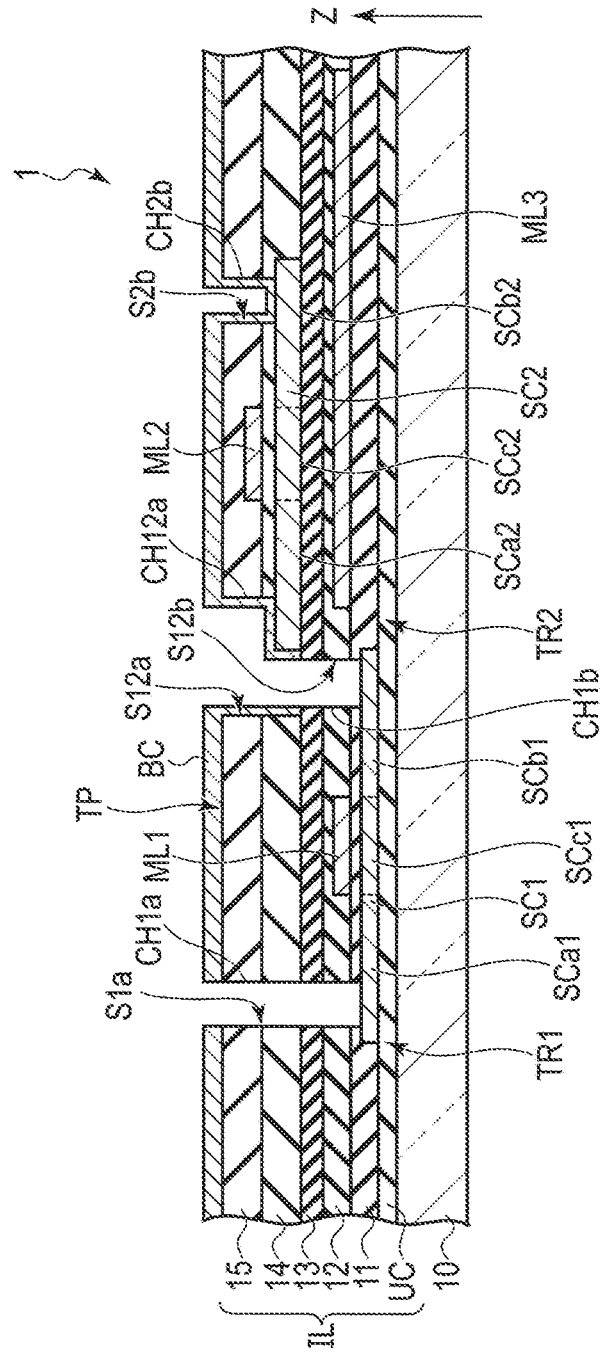
FIG. 7C is a cross-sectional view showing a step for forming a contact hole according to the third embodiment.
Figure 7D:
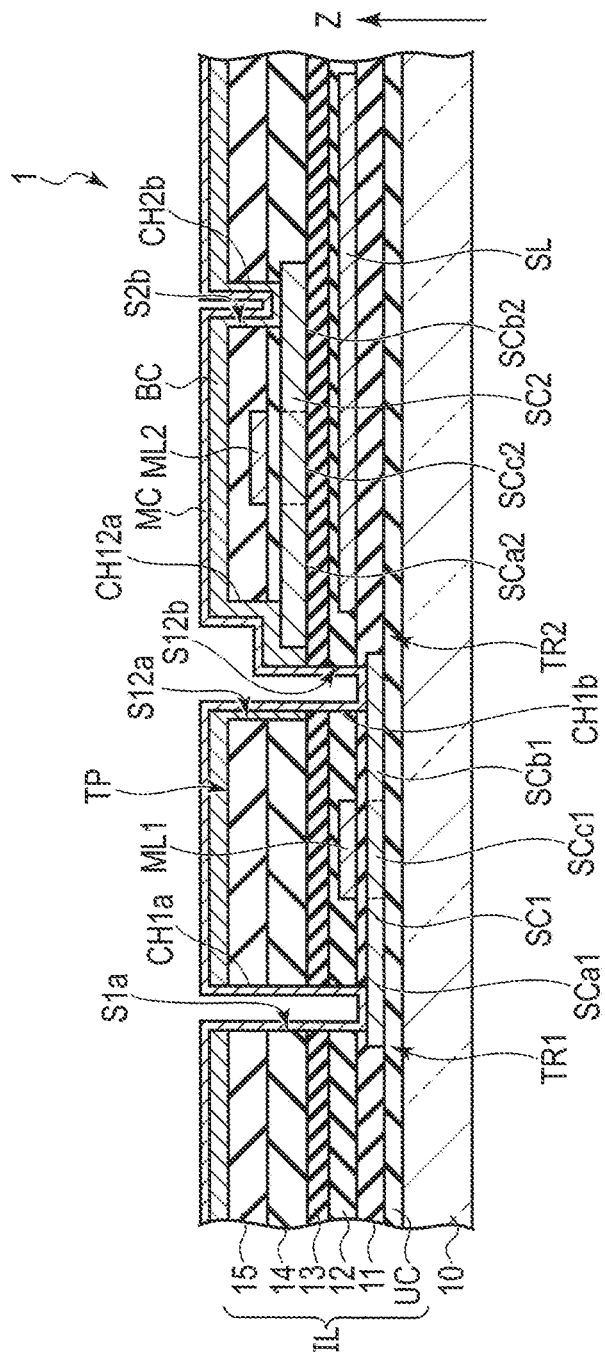
FIG. 7D is a cross-sectional view showing a step for forming a conductive layer according to the third embodiment.

FIG. 7A is a cross-sectional view showing a step for forming contact hole CH12a according to the present embodiment. FIG. 7B is a cross-sectional view showing a step for forming a barrier layer BC according to the present embodiment. FIG. 7C is a cross-sectional view showing a step for forming contact hole CH12b according to the present embodiment. FIG. 7D is a cross-sectional view showing a step for forming a conductive layer MC according to the present embodiment.

As shown in FIG. 7A, contact hole CH12a is formed in an insulating layer IL to semiconductor layer SC2 by photo-etching (or a photo-etching process). In the example of FIG. 7A, contact hole CH12a is formed by etching insulating films 14 and 15 from the portion above a low-resistive area SCa2 of semiconductor layer SC2 to the portion above semiconductor layer SC1. Contact hole HC12a is wider than contact hole CH2a of the above embodiments.

Subsequently, as shown in FIG. 7B, barrier layer BC is formed on the insulating layer IL in the state shown in FIG. 7A, and is formed on semiconductor layer SC2 via inner surface S12a of contact hole CH12a.

Subsequently, as shown in FIG. 7C, contact hole CH12b is formed by etching barrier layer BC and the insulating layer IL all together to semiconductor layer SC1 in the bottom portion inside the edge of contact hole CH12a. For example, photo-etching is used for this process. Subsequently, cleaning is performed to remove the natural oxide film of semiconductor layer SC1.

Further, as shown in FIG. 7D, conductive layer MC is formed on barrier layer BC shown in FIG. 7C, and is formed on semiconductor layer SC1 via inner surface S12a of contact hole CH12a and inner surface S12b of contact hole CH12b. Lastly, barrier layer BC and conductive layer MC shown in FIG. 7D are patterned all together by, for example, photo-etching. In this way, for example, terminals T1a, T2b and T12 of the semiconductor device 1 shown in FIG. 5 are formed.

Effects similar to those of the first embodiment are obtained by the third embodiment. In the semiconductor device 1 of the third embodiment, contact hole CH12b is formed inside the edge of contact hole CH12a. A single terminal T12 located in contact holes CH12a and CH12b electrically connects semiconductor layers SC1 and SC2. Thus, the third embodiment can form contact holes CH12a and CH12b in a small area to electrically connect thin-film transistors TR1 and TR2 in comparison with a case where contact hoes CH12a and CH12b are formed at different positions. In this way, it is possible to provide a structure advantageous to high fineness.

As explained above, the present embodiment can provide a semiconductor device which prevents decrease in reliability and is effectively manufactured.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device comprising:
   an insulating substrate;
   a first insulating layer;
   a second insulating layer located above the first insulating layer;
   a first semiconductor layer located between the insulating substrate and the first insulating layer, and
   a second semiconductor layer located between the first insulating layer and the second insulating layer and formed of a material different from a material of the first semiconductor layer,
   the method comprising:
   forming a first contact hole in the second insulating layer so as to reach the second semiconductor layer;
   forming a barrier layer on the second insulating layer and on the second semiconductor layer inside the first contact hole;
   forming a second contact hole in the barrier layer, the first insulating layer and the second insulating layer so as to reach the first semiconductor layer;
   forming a first conductive layer which is in contact with the barrier layer inside the first contact hole, and is in contact with the second semiconductor layer inside the second contact hole; and
   forming terminals by patterning the barrier layer and the first conductive layer together on the first contact hole and the second contact hole,
   wherein the barrier layer is conductive.

2. The method of claim 1, wherein
   cleaning is performed with hydrofluoric acid after the second contact hole is formed.

3. A method for manufacturing a semiconductor device comprising:
   an insulating substrate;
   a first insulating layer;

a second insulating layer located above the first insulating layer, a first semiconductor layer located between the insulating substrate and the first insulating layer, and a second semiconductor layer located between the first insulating layer and the second insulating layer and formed of a material different from a material of the first semiconductor layer, the method comprising:

forming a first contact hole in the first insulating layer and the second insulating layer so as to reach the first semiconductor layer;

forming a barrier layer on the second insulating layer and on the first semiconductor layer inside the first contact hole;

forming a second contact hole in the barrier layer and the second insulating layer so as to reach the second semiconductor layer;

forming a first conductive layer which is in contact with the barrier layer inside the first contact hole, and is in contact with the second semiconductor layer inside the second contact hole; and forming terminals by patterning the barrier layer and the first conductive layer together on the first contact hole and the second contact hole, wherein the barrier layer is conductive.

4. The method of claim 3, further comprising performing cleaning with hydrofluoric acid after the first contact hole is formed.

* * * * *